US 12,405,640 B2

(12) United States Patent
Grady et al.

(10) Patent No.: US 12,405,640 B2
(45) Date of Patent: Sep. 2, 2025

(54) ADAPTABLE HOUSING FOR LIGHT PIPES WITH DIFFERENT LIGHT PIPE ARRANGEMENTS

(71) Applicant: HEWLETT PACKARD ENTERPRISE DEVELOPMENT LP, Spring, TX (US)

(72) Inventors: John R. Grady, Cypress, TX (US); Joseph Allen, Tomball, TX (US); Sunil Rao Ganta Papa Rao Bala, Cypress, TX (US); Keith Sauer, Spring, TX (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 341 days.

(21) Appl. No.: 18/163,935

(22) Filed: Feb. 3, 2023

(65) Prior Publication Data

US 2024/0264643 A1    Aug. 8, 2024

(51) Int. Cl.
*H04B 10/00*  (2013.01)
*G06F 1/18*   (2006.01)
*H05K 7/14*   (2006.01)
*F21V 8/00*   (2006.01)

(52) U.S. Cl.
CPC ............... *G06F 1/181* (2013.01); *H05K 7/14* (2013.01); *G02B 6/0001* (2013.01)

(58) Field of Classification Search
CPC ........ G06F 1/181; H05K 7/14; G02B 6/0001; G02B 6/0095; G02B 6/0073; G02B 6/0081; G02B 6/0083; G02B 6/0086; G02B 6/3825
See application file for complete search history.

(56) References Cited

U.S. PATENT DOCUMENTS

| 5,876,239 A * | 3/1999 | Morin | H01R 13/717 439/490 |
| 5,938,324 A * | 8/1999 | Salmon | G09F 9/305 362/555 |
| 6,095,851 A * | 8/2000 | Laity | H05K 5/0273 439/910 |
| 6,099,152 A * | 8/2000 | Naganawa | B60Q 3/64 362/489 |
| 6,174,194 B1 * | 1/2001 | Bleicher | H01R 13/7175 439/490 |
| 6,231,224 B1 | 5/2001 | Gamble et al. | |
| 6,352,446 B2 * | 3/2002 | Ezawa | H01R 13/6691 439/490 |

(Continued)

*Primary Examiner* — Agustin Bello
(74) *Attorney, Agent, or Firm* — Hewlett Packard Enterprise Patent Department

(57) ABSTRACT

A light pipe housing for a drive carrier comprises a base structure having a front face, a back face, a first light pipe cavity, and a second light pipe cavity. The light pipe housing comprises a raised ramp extending between the first light pipe cavity and the second light pipe cavity, the raised ramp having a first edge adjacent to the first light pipe cavity and a second edge adjacent to the second light pipe cavity. The housing further comprises a top cover having a cut out portion. The base structure and top cover are in conjunction configured to carry any one of a first light pipe and a second light pipe for the drive carrier. The light pipe housing configured to carry one light pipe at a time. The first light pipe and the second light pipe have mutually different light pipe arrangements.

13 Claims, 6 Drawing Sheets

(56) References Cited

U.S. PATENT DOCUMENTS

| | | | |
|---|---|---|---|
| 6,457,992 B2 * | 10/2002 | Posey | H01R 13/60 |
| | | | 439/131 |
| 7,421,184 B2 * | 9/2008 | Long | G02B 6/0008 |
| | | | 439/490 |
| 8,861,972 B2 * | 10/2014 | Hosking | H04B 10/40 |
| | | | 398/138 |
| 9,083,123 B2 * | 7/2015 | Homan | H01R 13/7175 |
| 9,281,636 B1 * | 3/2016 | Schmitt | H01R 13/7172 |
| 9,405,080 B2 * | 8/2016 | Lambourn | H04Q 1/136 |
| 9,608,377 B1 * | 3/2017 | Phillips | H01R 13/7172 |
| 9,612,391 B2 * | 4/2017 | Wu | G02B 6/4256 |
| 9,784,927 B2 * | 10/2017 | Lambourn | G02B 6/3895 |
| 10,064,305 B1 | 8/2018 | Zhai et al. | |
| 11,200,920 B1 | 12/2021 | Chang et al. | |
| 11,774,691 B2 * | 10/2023 | Wang | G02B 6/4262 |
| | | | 340/815.42 |
| 11,906,801 B2 * | 2/2024 | Briant | G02B 6/4268 |
| 12,000,547 B1 * | 6/2024 | Lands | F21V 21/088 |
| 2004/0257760 A1 | 12/2004 | Record et al. | |
| 2005/0254257 A1 * | 11/2005 | Long | H01R 13/659 |
| | | | 362/581 |
| 2010/0111476 A1 * | 5/2010 | Shirk | H01R 13/7172 |
| | | | 385/53 |
| 2011/0230065 A1 * | 9/2011 | Bergner | G02B 6/426 |
| | | | 439/55 |
| 2014/0023326 A1 * | 1/2014 | Anderson | G02B 6/3895 |
| | | | 385/77 |
| 2014/0023328 A1 * | 1/2014 | Lambourn | G02B 6/42 |
| | | | 385/92 |
| 2019/0296493 A1 * | 9/2019 | Liu | G02B 6/0001 |
| 2021/0364687 A1 * | 11/2021 | Wang | G02B 6/4262 |
| 2022/0342463 A1 | 10/2022 | Norton et al. | |
| 2024/0264643 A1 * | 8/2024 | Grady | H05K 7/14 |

* cited by examiner

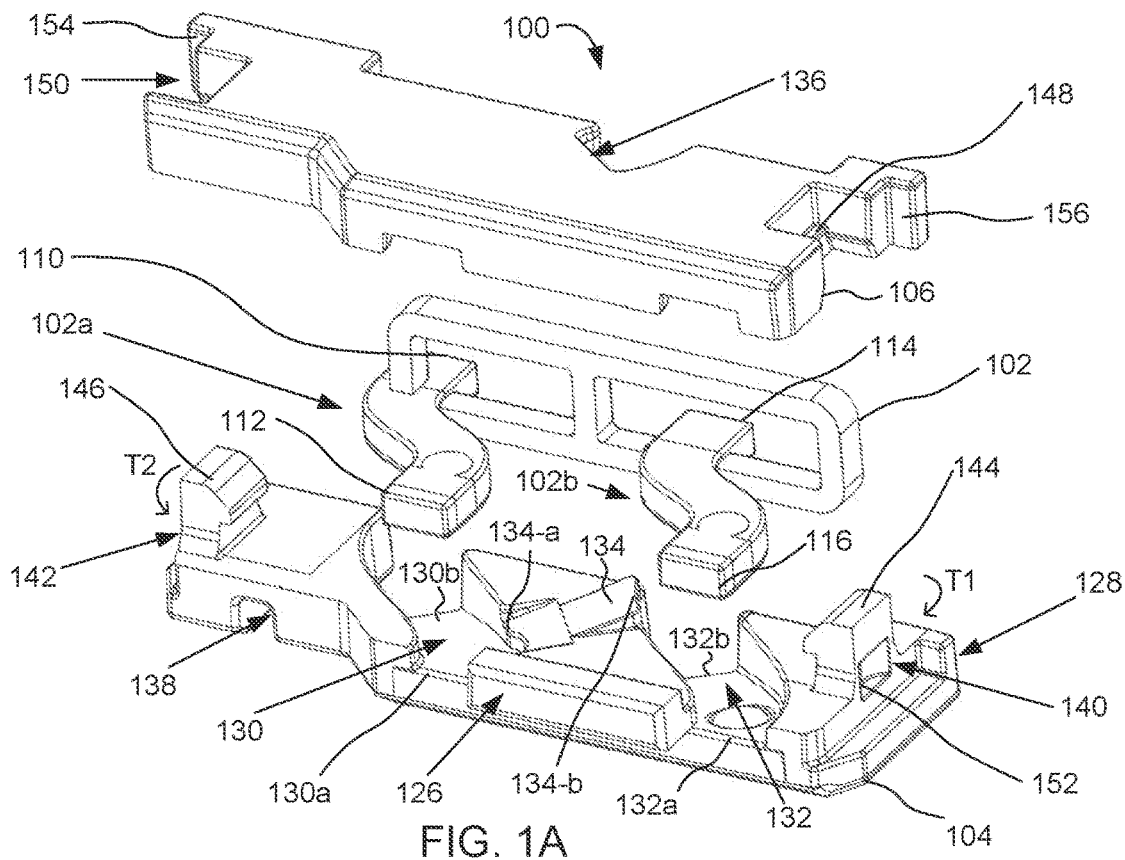

US 12,405,640 B2

ADAPTABLE HOUSING FOR LIGHT PIPES WITH DIFFERENT LIGHT PIPE ARRANGEMENTS

BACKGROUND

Electronic devices (such as computing systems) may include one or more media drives such as, solid state drives ("SSDs"), hard disk drives ("HDDs"), CD ROM drives, or DVD drives. One or more receiving locations (e.g., drive bays) can be included in the chassis of an electronic device for receiving these media drives. The media drives (drives) can either be directly mounted within those receiving locations, or may be first received in a drive carrier, which is itself receivable in the receiving location. A drive carrier may be used, for example, in a computing system (e.g., a server, a high-performance-compute system, a data storage appliance, a converged or hyperconverged system, or other computing systems) to facilitate installation and uninstallation (e.g., hot-swapping) of a media drive to the computing system.

Drive carriers are used to configure media drives, such as SSDs, as Field Replaceable Units (FRUs), allowing the drives to be hot swapped into a computing system. Drive carriers are therefore defined by the physical form of the SDD, or drive, which they are configured to carry and are standardized by an industry form factor (e.g., an SDD form factor). An Enterprise & Data Center Standard Form Factor (EDSFF), for example, is designed for use in data centers in servers with storage devices such as SSDs. As a form factor, it defines specifications such as the dimensions and electrical interfaces storage devices should have, to ensure data center operators, server manufacturers, and SSD manufacturers, can make products that work with products from multiple manufacturers. As used herein, an EDSFF drive therefore refers to a drive that has a form factor specified in one of the standards in the EDSFF family of standards, including, but not limited to, a form factor specified in SFF-TA-1006, SFF-TA-1007, or SFF-TA-1008, and an EDSFF drive carrier is a drive carrier configured to carry and support an EDSFF drive. Since different drives, may have different physical dimensions, the drives may also have different card edge placements, different mounting hole locations, and different LED indicator placements. Thus, different drive carriers are used for different drives having different physical dimensions.

BRIEF DESCRIPTION OF THE DRAWINGS

The present disclosure is best understood from the following detailed description when read with the accompanying figures, wherein:

FIG. 1A is an exploded view of a light pipe housing with a first light pipe according to an example of the present subject matter;

FIG. 1B is an exploded view of the light pipe housing of FIG. 1A with a second light pipe;

Figure 2A:
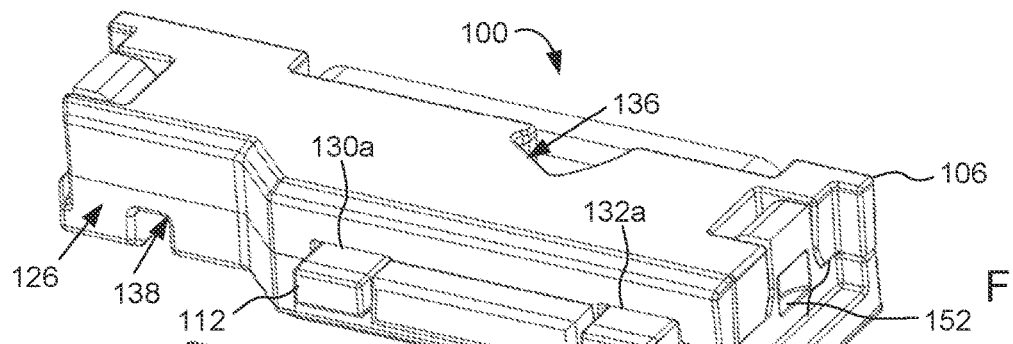
FIG. 2A is a front perspective view of the light pipe housing of FIG. 1A with a first light pipe installed therein.

It is emphasized that in accordance with the standard practice in the industry, various features are not drawn to scale. In fact, the dimensions of the various features may be arbitrarily increased or reduced for clarity of discussion or illustration.

DETAILED DESCRIPTION

Illustrative examples of the subject matter claimed below are disclosed. In the interest of clarity, not all features of an actual implementation are described in this specification. It will be appreciated that in the development of any such actual implementation, numerous implementation-specific decisions may be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

As used herein, the article "a" is intended to have its ordinary meaning in the patent arts, namely "one or more." Herein, the term "about" when applied to a value generally means within the tolerance range of the equipment used to produce the value, or in some examples, means plus or minus 10%, or plus or minus 5%, or plus or minus 1%, unless otherwise expressly specified. Further, herein the term "substantially" as used herein means a majority, or almost all, or all, or an amount with a range of about 51% to about 100%, for example. Moreover, examples herein are intended to be illustrative only and are presented for discussion purposes and not by way of limitation.

As used herein, to "provide" an item means to have possession of and/or control over the item. This may include, for example, forming (or assembling) some or all of the item from its constituent materials and/or, obtaining possession of and/or control over an already-formed item.

Indicator LEDs are generally used to indicate the state of a drive. A drive may have an activity indicator LED and a status indicator LED. The activity indicator LED may flash whenever the drive is accessed (generally for read/write operations). The status indicator LED may indicate different states of operation of the drive. For example, the status indicator LED may indicate when the drive is not yet discovered by the system, when the drive is online, when the drive is being prepared for removal, or when the drive is subjected to a failure. Different drives, having different physical dimensions, may have different indicator ED placements. In particular, the location of a drive indicator LED for an SSD conforming with E1.S ESDFF specification may be different from the location of a drive indicator LED for an SSD conforming with E3.S EDSFF specification. Due to this difference in location of the indicator LEDs, different light pipe designs are used for different drives conforming with different form factor specifications. To support these different light pipe designs, designs of drive carriers for different drives vary. Designing, tooling, manufacturing, and installing these different drive carriers for different drives involves additional time and cost. Further, stocking of differently designed drive carriers and management of such stocks also adds to additional effort and cost for inventory management.

The subject matter disclosed herein provides an adaptable light pipe housing for differently designed light pipes, so that the light pipe housing (that is able to hold light pipes of varying designs) may be fitted in a common drive carrier for different drives having varying form factor specifications. In some examples, the present subject matter provides a common drive carrier to be used for EDSFF drives having any one of E1.S or E3.S form factor specifications. Since, the light pipe housing installed within the drive carrier may house light pipes of varying designs, any light pipe may be fitted within the housing depending on which EDSFF drive, E1.S or E3.S, is to be installed in the drive carrier. By having the common light pipe housing fitted in the carrier, a common drive carrier may be used for multiple drives having varying form factor specifications instead of using uniquely designed drive carriers for each type of drive. By utilizing a common drive carrier fitted with the adaptable light pipe housing, development and production of the drive carriers may be simplified and may be cost effective.

Examples of adaptable light pipe housings are described herein. The light pipe housings are adaptable to accommodate a plurality of differently designed light pipes meant for different EDSFF drives having differing dimensions such as are found in varying specifications for EDSFF form factors. In some examples, the light pipe housing may comprise a base structure and top cover that in conjunction are configured to carry any one of a first light pipe and a second light pipe for a drive carrier, where the first light pipe and the second light pipe have mutually different light pipe arrangements. In an example, the design of the light pipe housing is such that it can hold a light pipe for an EDSFF drive having E1.S specification as well as it can also hold a light pipe for an SSD conformant with E3.S specification, where the light pipe housing is configured to carry one light pipe at a time. Since, the housing is inserted in a common drive carrier, a common drive carrier may be used for two different EDSFF drives conformant with different (E1.S or E3.S) form factor specifications. Thus, by utilizing a common drive carrier fitted with the adaptable light pipe housing, development and production of drive carriers and light pipe housings may be simplified and may be cost effective.

FIG. 1A is an exploded view illustrating a light pipe housing 100 according to an example of the present subject matter. The light pipe housing 100 may hold a light pipe 102 designed to fit with an EDSFF drive having E3.S form factor specifications. The drive may have a first indicator light-emitting diode (LED) on a front face thereof for indicating power and activity of drive. The drive may have a second indicator LED on the front face for indicating operation or error conditions for the drive. In an example, the light pipe housing 100 may be fitted in a drive carrier for the drive.

The light pipe housing 100 has a two-piece construction that includes a base structure 104 and a top cover 106. The base structure 104 and the top cover 106 may be snap-fitted to each other. The base structure 104 and the top cover 106 are in conjunction configured to carry the light pipe 102. The light pipe 102 is also referred to as the first light pipe 102. In some examples, the base structure 104 and the top cover 106 are in conjunction configured to carry a second light pipe 108, as shown in FIG. 1B. The second light pipe 108 is designed to fit with an EDSFF drive having E1.S form factor specifications. The light pipe housing 100 is configured to carry one light pipe at a time. The first light pipe 102 and the second light pipe 108 have mutually different light pipe arrangements configured to receive light from mutually different LED arrangements associated with different form factors of drives. That is, in some examples, the first light pipe 102 is designed to be utilized with a drive compliant with E3.S form factor specifications which has two LEDs arranged in horizontal arrangement (e.g., at two predetermined locations spaced apart along a horizontal line), whereas, the second light pipe 108 is designed to be utilized with a drive compliant with E1.S form factor specifications which has two LEDs arranged in a vertical arrangement (e.g., at two predetermined locations spaced apart along a vertical line).

As shown in FIG. 1A, the light pipe 102 has a pair of elongate light conductor portions 102a and 102b. The light conductor portion 102a extends between a light receiving end 110 and a light transmitting end 112 and the light conductor portion 102b extends between a light receiving end 114 and a light transmitting end 116. When light pipe housing 100 and the light pipe 102 are installed in a drive carrier, the light receiving ends 110 and 114 are disposed near a rear side of a front rail (e.g., front rail 406 described below) so as to be adjacent to (e.g., directly in front of) the LED locations of a drive carried by the drive carrier, wherein the drive has a first LED light arrangement, for example an arrangement comprising horizontally aligned LEDs. Referring to FIG. 1B, the second light pipe 108 has a generally Y-shaped configuration including first and second elongate light conductors 108-a and 108-b. The first light conductor 108-a extends between light receiving end 118 and light transmitting end 120 and the second light conductor 108-b extends between light receiving end 122 and light transmitting end 124. When light pipe housing 100 and the second light pipe 108 are installed in a drive carrier, the light receiving ends 118 and 120 are disposed near a rear side of a front rail (e.g., front rail 406) so as to be adjacent to (e.g., directly in front of) the LED locations of a second type of drive carried by the drive carrier, wherein the second type of drive has a second LED light arrangement different, for example an arrangement comprising vertically aligned LEDs.

In FIGS. 1A and 1B, the first and second light pipes 102a and 102b that may be supported within housing 100 are configured to be compatible with the indicator LED positioning of EDSFF drives having E3.S form factor specifications and the first and second light pipes 108-a and 108-b that may be supported within housing 100 are configured to be compatible with the indicator LED positioning of EDSFF drives having E1.S form factor specifications. In particular, light receiving end 110 of first light pipe 102a and light receiving end 114 of second light pipe 102b are oriented to be proximal to the indicator LEDs of E3.S EDSFF drives, and thus the light receiving ends 110 and 114 are horizontally aligned with one another at a spacing and location congruent with the LEDs of the E3.S EDSFF drives while coupled to the drive carrier. On the other hand, while light receiving end 118 of first light pipe 108-a and second light receiving end 122 of second light pipe 108-b are oriented to be proximal to the indicator LEDs of E1.S EDSFF drives, and thus the light receiving ends 118 and 120 are horizontally aligned with one another at a spacing and location congruent with the LEDs of the E1.S EDSFF drives while coupled to the drive carrier. Thus, regardless of whether a drive carrier has an E1.S EDSFF drive or an E3.S EDSFF drive installed therein, the adaptable housing 100 according to examples herein may hold either a first light pipe 102 with two elongate light conductor portions 102a and 102b or a second light pipe 108 with two elongate light conductor portions 108-a and 108-b. The first light pipe 102 and the second light pipe 108 are adapted to redirect light from the indicator LEDs of the EDSFF drives to their respective light transmitting ends, viz., light transmitting ends 112 and 116 for the first light pipe 102 and light transmitting end 120 and 122 for the second light pipe 108. Further, the spacing and orientation of light transmitting ends 112; 116 and 120; 124 on a front face 126 of the base structure 104 is the same regardless of whether an E1.S EDSFF drive or E3.S EDSFF drive is installed.

Referring back to FIG. 1A, the base structure 104 has a back face 128 opposite to the front face 126. The front face 126 refers to a surface of the base structure 104 facing the user of the light pipe housing 100 when the light pipe housing 100 is mounted in a drive carrier. The base structure 102 also comprises a first light pipe cavity 130 having a first end 130a at the front face 126 and a second end 130b at the back face 128 and a second light pipe cavity 132 spaced apart from the first light pipe cavity 130. The second light pipe cavity 132 has a first end 132a at the front face 126 and a second end 132b at the back face 128. Each of the first and second light pipe cavities 130 and 132 are channels formed on the base structure 104 and are configured to hold a light pipe therein.

The base structure 104 further comprises a raised ramp 134 extending between the first light pipe cavity 130 and the second light pipe cavity 132. The raised ramp 134 has a first edge 134b adjacent to the first light pipe cavity 130 and a second edge 134b adjacent to the second light pipe cavity 132. Further, as shown in FIG. 1A, the top cover 106 has a cut out portion 136. When the top cover 106 is engaged with the base structure 104, the cut-out portion 136 is positioned above the second edge 134b of the raised ramp 134 and the second edge 134b of the raised ramp 134 is parallel to an edge of the cut out portion 136. The base structure 104 further comprises a slot 138 running through the front face 126 and the back face 128 of the base structure 104. The slot 138 is configured to receive a ridged extension formed on a base surface of an adaptor formed in a recess in a drive carrier. In various implementations, the base structure 104, the top cover 106, and the subparts/portions therein, are formed from a plastic material. Examples of the plastic material may include polycarbonate and polycarbonate/acrylonitrile butadiene styrene (PC-ABS).

The base structure 104 further comprises a pair of sidewalls 140 and 142 (also referred to as first sidewall 140 and second sidewall 142) extending between the front face 126 and the back face 128. The first and second sidewalls 140 and 142 may extend perpendicularly between the front face 126 and the back face 128. A first locking clip 144 is formed on the first sidewall 140 and a second locking clip 146 is formed on the second sidewall 142. The top cover 106 has a first groove 148 to engage with the first locking clip 144 and a second groove 150 to engage with the second locking clip 146 when the top cover 106 is fitted on the base structure 104. The first and second locking clips 144 and 146 may interlock with the first and second grooves 148 and 150 to ensure that the top cover 106 is snap fitted on the base structure 104. When the top cover 106 is assembled to the base portion 104, the locking clips 144 and 146 in the base portion 104 may flex to allow the top cover 106 to fit in position on the base portion 104. In particular, referring to FIG. 1A, the first locking clip 144 may flex in a direction as indicated by arrow T1 and the second locking clip 146 may flex in a direction as indicated by arrow T2. Since the first and second locking clips 144 and 146 are made of plastic material, once the top cover 106 is fitted in position over the base portion 104, the first and second locking clips 144 and 146 may snap back in an upright position and thereby fit into the first and second grooves 148 and 150 of the top cover 106 to removably fasten the top cover 106 to the base portion 104.

The base structure 104 also has a locking receptacle 152. The locking receptacle 152 is formed on the first sidewall 140 of the base structure 104. Although not shown in the figures, a locking receptacle similar to the locking receptacle 152 may also be formed on the second sidewall 142. Thus, a locking receptable may be formed on each of the pair of sidewalls 140 and 142. Each of the locking receptacles are configured to receive a respective flange formed on an adaptor in a body of a drive carrier (shown in FIGS. 5A and 5B).

Further, the top cover 106 comprises a first retaining wall portion 154 and a second retaining wall portion 156. When the light pipe housing 100 is inserted in a recess of a drive carrier frame (FIGS. 5A and 5B), the first and second retaining wall portions 154 and 156 may move inside respective wall portion receptacles formed in the drive carrier frame (shown in FIGS. 5A and 5B). A wall portion receptacle is formed on each side of the recess in the drive carrier frame to receive one of the first and second retaining wall portions 154 and 156. Once, the retaining wall portions 154 and 156 are inside the receptacles, the light pipe housing 100 may be prevented from sliding out of the recess.

Figure 2B:
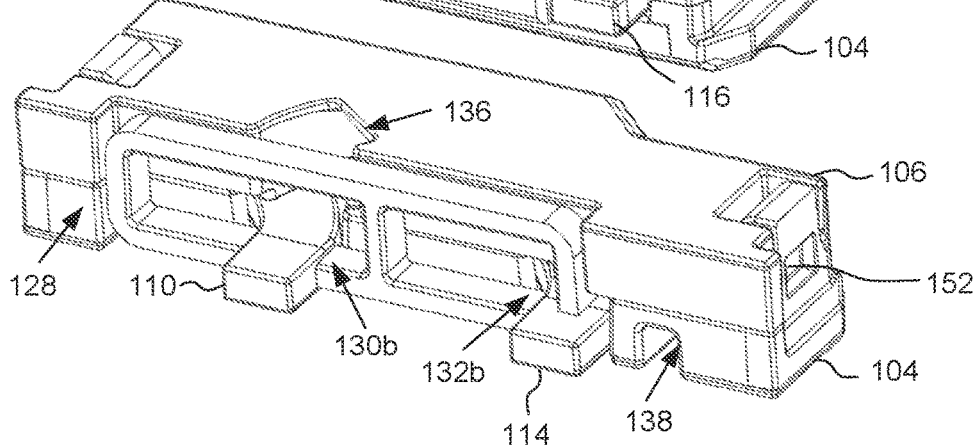
FIG. 2B is a rear perspective view of the light pipe housing of FIG. 1A with a first light pipe installed therein.

FIGS. 2A and 2B illustrate front and rear perspective views of the light pipe housing 100 of FIG. 1 with the first light pipe 102 installed therein. Referring to FIG. 2A, the top cover 106 is fitted to the base structure 104 and the first light pipe 102 is held therebetween. The light transmitting end 112 of the first light conductor portion 102a of the first light pipe 102 protrudes out of the first end 130a of the first light pipe cavity 130. The light transmitting end 116 of the second light conducting portion 102b of the first light pipe 102 protrudes out of the first end 132a of the second light pipe cavity 132. Referring to FIG. 2B, the light receiving end 110 of the first light conductor portion 102a of the first light pipe 102 is to protrude out of the second end 130b of the first light pipe cavity 130. The light receiving end 114 of the second light conductor portion 102b of the first light pipe 102 is to protrude out of the second end 130b of the second light pipe cavity 132.

Figure 3A:
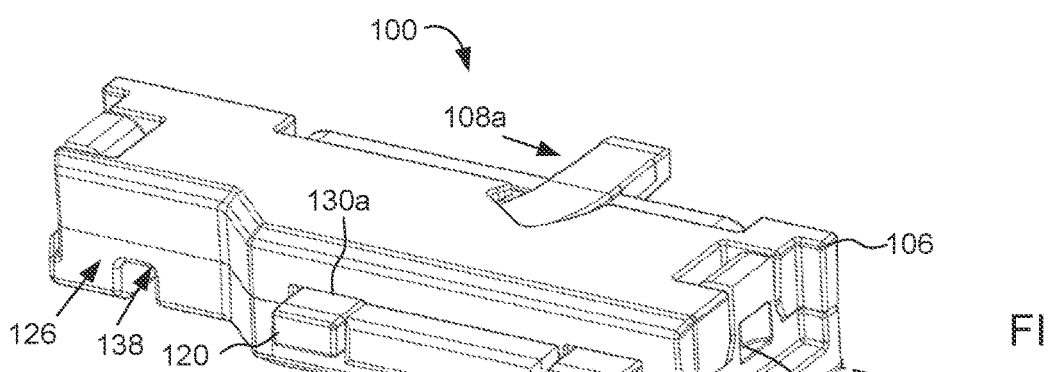
FIG. 3A is a front perspective view of the light pipe housing of FIG. 1B with a second light pipe installed therein.
Figure 3B:
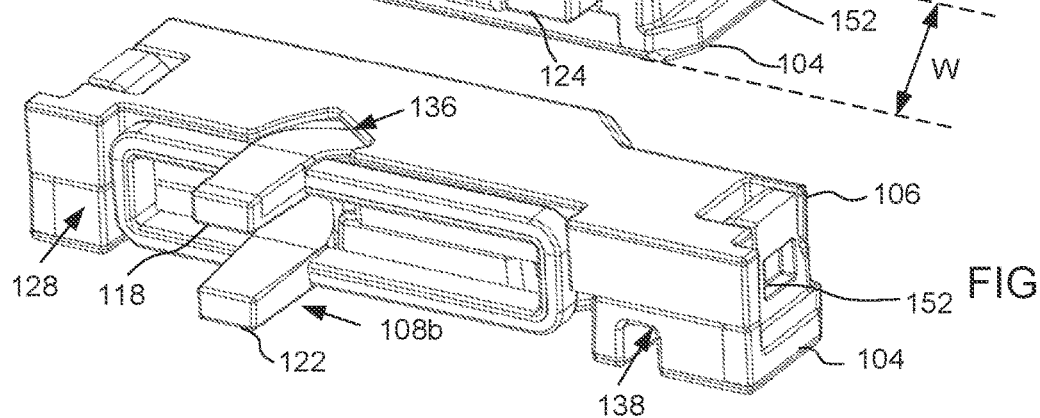
FIG. 3B is a rear perspective view of the light pipe housing of FIG. 1B with a second light pipe installed therein.

FIGS. 3A and 3B illustrate front and rear perspective views of the light pipe housing 100 of FIG. 1 with the second light pipe 108 installed therein. The top cover 106 is fitted to the base structure 104 and the second light pipe 108 is held therebetween. As shown in FIG. 3A, the light transmitting end 120 of the first light conductor portion 108a of the second light pipe 108 protrudes out of the first end 130a of the first light pipe cavity 130. The light transmitting end 124 of the second light conductor portion 108b of the second light pipe 108 protrudes out of the first end 132a of the second light pipe cavity 132. The light receiving end 118 of the first light conductor portion 108-a of the second light pipe 108 is to protrude out the cut out portion 136. At least a portion of the first light conductor portion 108-a is configured to be held between an edge of the cut out portion 136 and an edge of the raised ramp (not shown in FIGS. 3A and 3B), such that the light receiving end 118 of the first light conductor portion 108-a of the second light pipe 108 protrudes out of the cut out portion 136. The light receiving end 122 of the second light conductor portion 108-b of the second light pipe 108 is to protrude out of the second end 132b of the second light pipe cavity 132. The thickness of the base portion 104 is "W" millimeters (mm). In some examples, the thickness 'W' may range between 5.5 mm to 7.5 mm.

Figure 4:
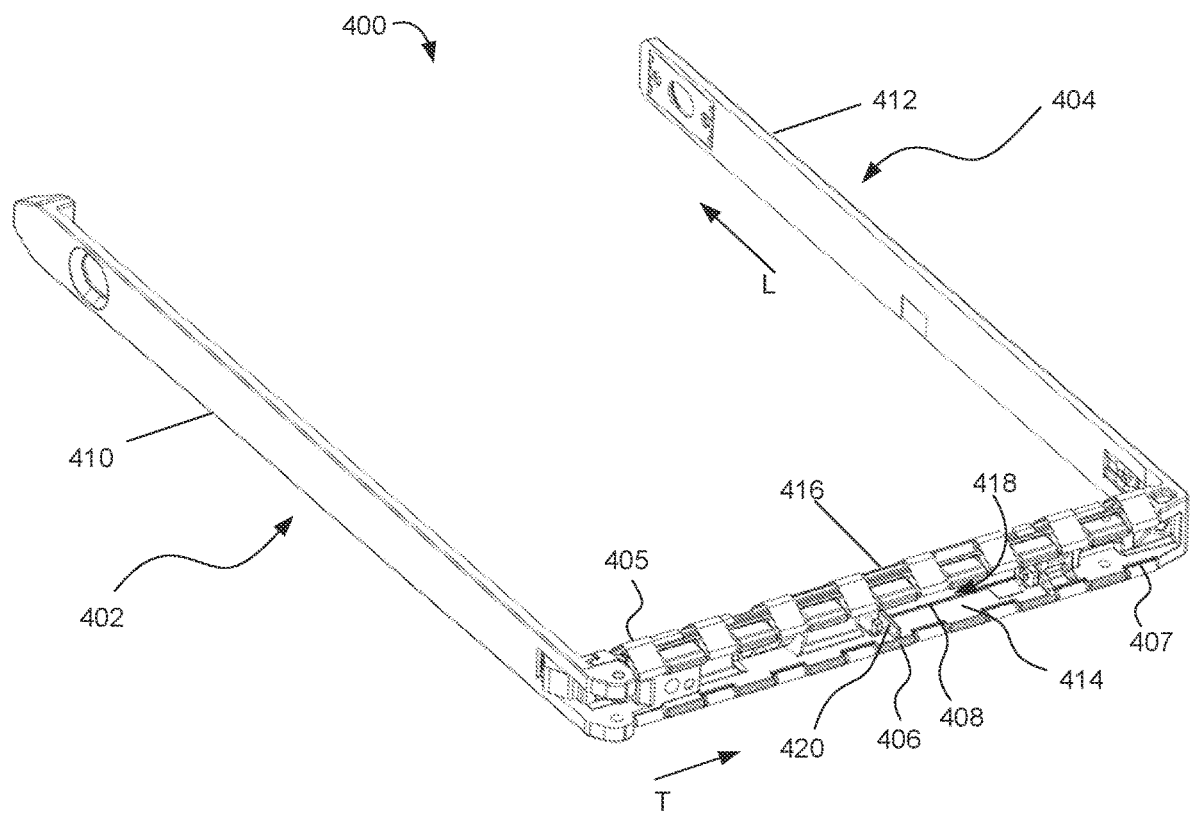
FIG. 4 is an isometric view illustrating a drive carrier frame according to an example of the present subject matter.

FIG. 4 is a top isometric view illustrating a drive carrier 400 also referred to as a "drive carrier frame 400" or "frame 400." As shown in FIG. 4, the frame 400 comprises a hybrid, two-piece construction including a first frame section 402 that is made from a metal material and a second frame section 404 that is made from a plastic material. The first and second frame sections 402 and 404 are connected, such that together they form a structure configured to receive and carry a media drive for an electronic device (e.g., a computing device), including, but not limited to an SSD. In one implementation, as described further below, the frame 400 is configured to receive and carry an EDSFF drive. It should be understood, however, that FIG. 4 is not intended to illustrate specific shapes, dimensions, or other structural details accurately or to scale, and that implementations of the frame 400 may have different numbers and arrangements of the illustrated components and may also include other parts that are not illustrated. Furthermore, it should be understood that the disclosed frame 400 may be used to carry various types and configurations of media drives, having different shapes, dimensions, and features, and is not intended to be restricted to a particular drive technology.

The frame 400 includes a front rail 406 comprising a first end portion 405, a second end portion 407, and a body 408 extending along a transverse direction T between the first and second end portions 405 and 407. The frame 400 also includes a first side rail 410 extending from the first end portion 405 of the front rail 406 along a longitudinal direction L perpendicular to the transverse direction T and a second side rail 412 extending from the second end portion 407 of the front rail 406 along the longitudinal direction L perpendicular to the transverse direction T and parallel to the first side rail 410. In this manner, the front rail 406 in conjunction with the first and second side rails 410 and 412 together form a frame 400 that is configured to receive a substantially cuboid shaped drive (in an open space defined between the first and second side rails 112 and 114) and to carry the drive for insertion into a substantially cuboid shaped drive bay. The body 408 of the front rail 406, for example, includes a front face 414 and a back face 416, and in a state of the drive mounted to the frame 400 the back face 416 is adjacent to and faces the drive. The first and second side rails 112 and 114 are configured to slide into the drive bay, and in an installed state of the frame 400 in the drive bay the front face 414 is accessible to a user.

The front rail 406 comprises a recess 418. The recess 418 is a through hole formed in the body 408 of the front rail 406. The recess 418 is configured to receive and carry a light pipe housing, such as the light pipe housing 100 illustrated in FIGS. 1 to 3B. A ridged extension 420 (seen in the enlarged view of FIG. 5A) is formed on the body 408 of the front rail 406. The base portion 104 of a light pipe housing 100 has the slot 138 (shown in FIGS. 1 to 3B) configured to receive the ridged extension 420. The light pipe housing 100 (fitted with first light pipe 102 or the second light pipe 108) may be inserted into the recess 418 along the longitudinal direction L. When the light pipe housing 100 is inserted into the recess 418, the slot 138 may slide against the ridged extension 420. It may be noted that if the light pipe housing 100 can be inserted into the recess 418 once the slot 138 is aligned with the ridged extension 420. Thus, the ridged extension 410 allows for keying the light pipe housing 100 into the recess 418.

Figure 5A:
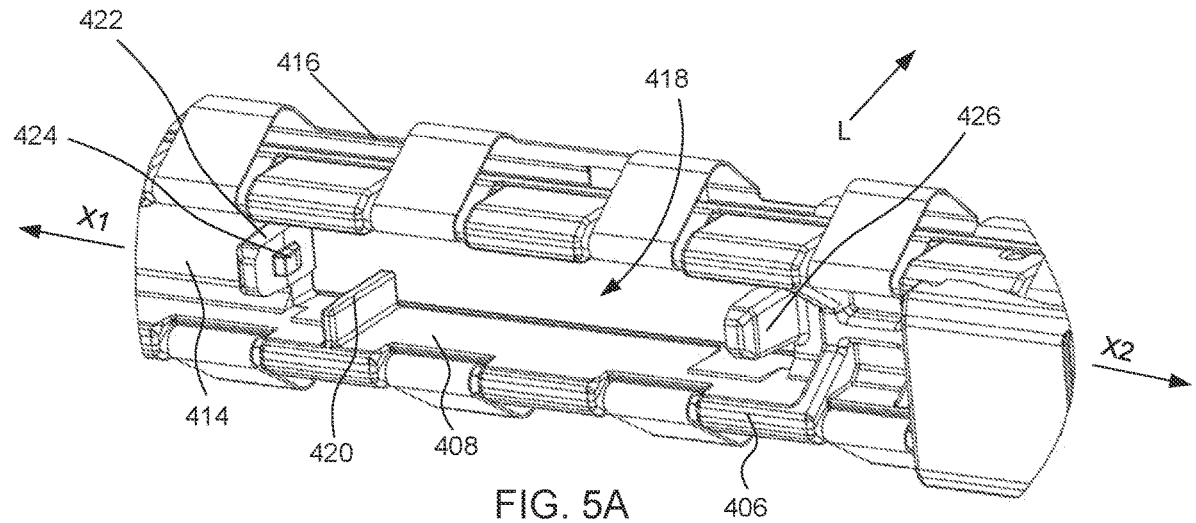
FIG. 5A is a front enlarged partial view of the drive carrier frame of FIG. 4.

FIG. 5A is a front enlarged partial view of the drive carrier frame 400 of FIG. 4. A portion of the front rail 406 is shown in FIG. 5A. A first adaptor 422 is formed on the body 408 of the front rail 406. The first adaptor 422 forms a sidewall of the recess 418 extending opposite to the longitudinal direction L. The first adaptor 422 comprises a first flange 424. When the light pipe housing 100 is inserted in the recess 418, the first flange 424 may slide in a locking receptacle (such as locking receptable 152 shown in FIGS. 1 to 3B).

Figure 5B:
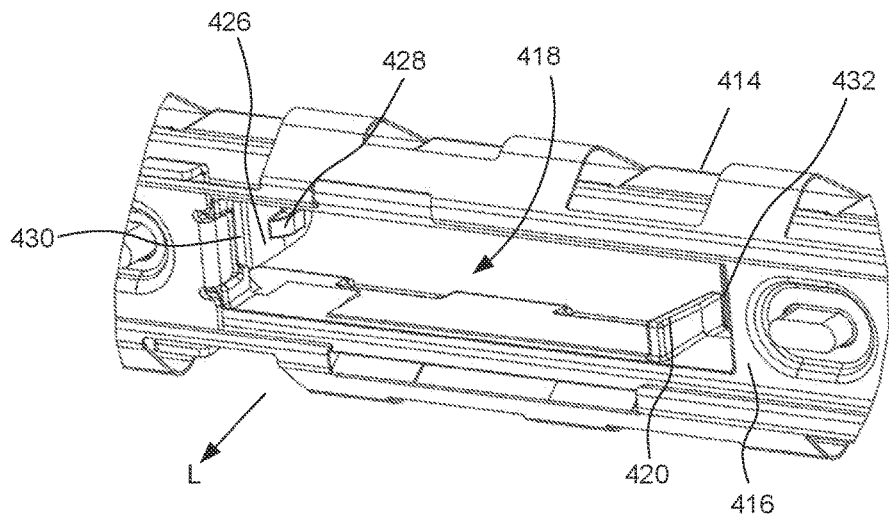
FIG. 5B is a rear enlarged partial view of the drive carrier frame of FIG. 4.

FIG. 5B is a rear enlarged partial view of the drive carrier frame 400 of FIG. 4. The second adaptor 426 is formed on the body 408 of the front rail 406. The second adaptor 426 forms a sidewall of the recess 418, opposite to the first adaptor 422, and extends opposite to the longitudinal direction L. The second adaptor 426 comprises a second flange 428. When the light pipe housing 100 (FIGS. 1 to 3B) is inserted in the recess 418, the second flange 428 may slide in the locking receptable 152 (FIGS. 1 to 3B). Thus, each of the first and second flanges 424 and 428 are received by respective locking receptacles formed in the base portion 104 of the light pipe housing 100 (FIGS. 1 to 3B). Since, the first and second flanges 424 and 428 are locked in their respective receptacles, the light pipe housing is prevented from shifting from its position within the recess 418. This provides a tight coupling between the light pipe housing 100 and the drive carrier frame 400 thereby allowing users to hot swap the drive carrier frame 400 (installed with the light pipe housing 100) from drive bays easily without the risk of the light pipe housing getting displaced from its position. When the light pipe housing 100 is inserted in the recess 418, the adaptors 422 and 426 in the base portion 104 may flex to allow the top cover 106 to fit in position on the base portion 104. In particular, referring to FIG. 5A, the first adaptor 422 may flex in a direction as indicated by arrow X1 and the second adaptor 424 may flex in a direction as indicated by arrow X2. Since the first and second adaptors 422 and 426 are made of plastic material, once the light pipe housing 100 is fitted in the recess 418, the first and second adaptors 422 and 426 may elastically snap back to their original position. As the adaptors 422 and 426 snap back to their original positions, the first and second flanges 424 and 426 are received by respective locking receptacles formed in the base portion 104 of the light pipe housing 100 thereby locking the light pipe housing 100 in the recess 418. (Further, the frame 400 comprises a first wall portion receptacle 430 and a second wall portion receptacle 432. The first and second wall portion receptacles 430 and 432 are formed on a portion of the body 408 of the frame 400 that forms a boundary to the recess 418. When the light pipe housing 100 is inserted in the recess 418, the retaining wall portions (154 and 156 shown in FIG. 1A) may slide into the wall portion receptacles 430 and 432. In particular, the first retaining wall portion 154 of the light pipe housing 100 may slide into the first wall portion receptacle 430 and the second retaining wall portion 156 of the light pipe housing 100 may slide into the second wall portion receptacle 432 thereby forming a tight fit between the wall portions and respective receptacles. This prevents the light pipe housing 100 to slide out of the recess 418.

In various implementations, the first frame section 402 includes the first side rail 410 and the second frame section 404 includes both the front rail 406 and the second side rail 412. Thus, in such implementations, the first side rail 410 is formed from a metal material and the front rail 406 and second side rail 412 are formed from a plastic material. The first side rail 410 may for example, be formed from a die cast zinc, while the front rail 406 and the second side rail 412 may for example, be integrally formed together from a polycarbonate. Furthermore, in some implementations, the front rail 406 and second side rail 412 are formed from polycarbonate/acrylonitrile butadiene styrene (PC-ABS).

Figure 6A:
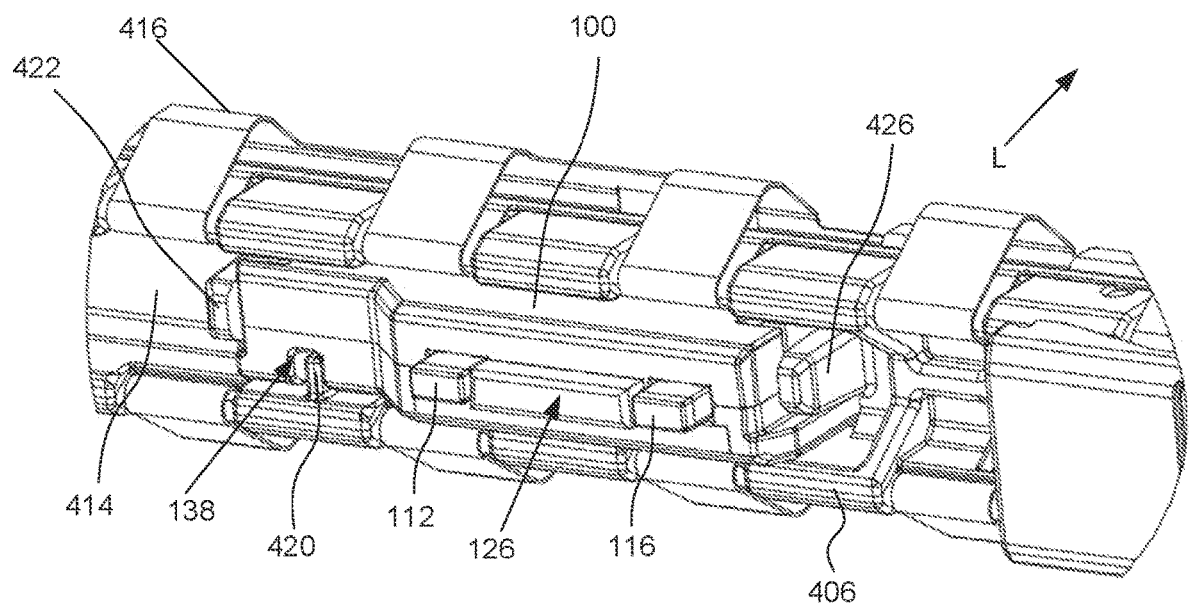
FIG. 6A is a front enlarged partial view of the drive carrier frame of FIG. 4 fitted with the light pipe housing of FIG. 1A.
Figure 6B:
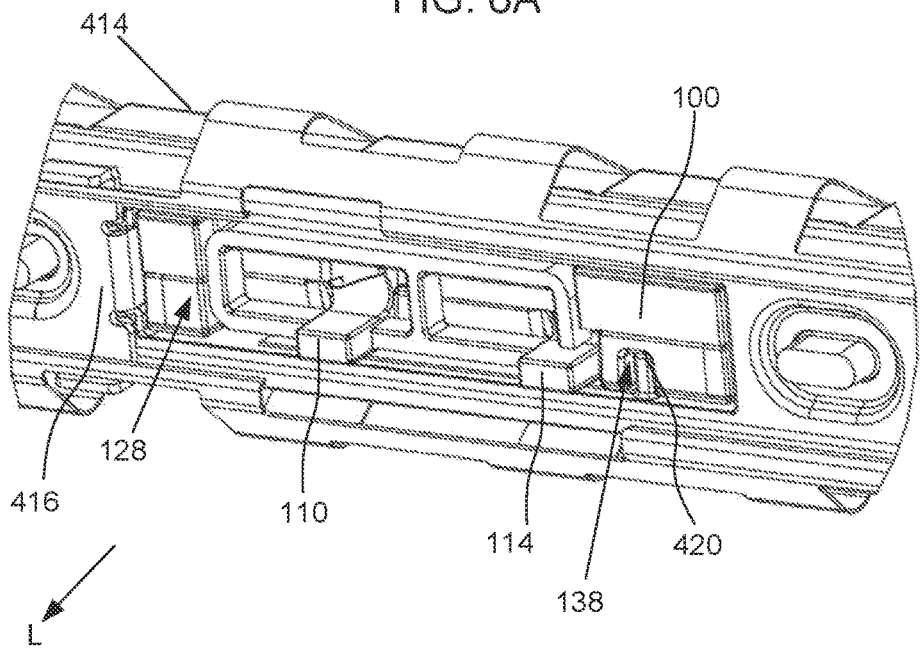
FIG. 6B is a rear enlarged partial view of the drive carrier frame of FIG. 4 fitted with the light pipe housing of FIG. 1A.

FIG. 6A is a front enlarged partial view of the drive carrier frame 400 of FIG. 4 fitted with the light pipe housing 100 of FIG. 1A. FIG. 6B is a rear enlarged partial view of the drive carrier frame 400 of FIG. 4 fitted with the light pipe housing 100 of FIG. 1A. In FIG. 6A, the light pipe housing 100 is shown to be fitted with the first light pipe 102. In some implementations, the light pipe housing 100 fitted with the second light pipe 108 (FIGS. 3A, 3B) may be mounted in the drive carrier frame 400. The light transmitting ends 112 and 116 of the first light pipe 102 protrude out of the first end 130a of the first light pipe cavity 130 (shown in FIG. 1-3B). The light receiving ends 110 and 114 of the first light pipe 102 protrude out of the second end 130b of the first light pipe cavity 130 (shown in FIG. 1-3B). As the light pipe housing 100 is inserted in the recess 418 (FIG. 5A) of the drive carrier frame 400, the ridged extension 420 occupies the slot 138.

Figure 7:
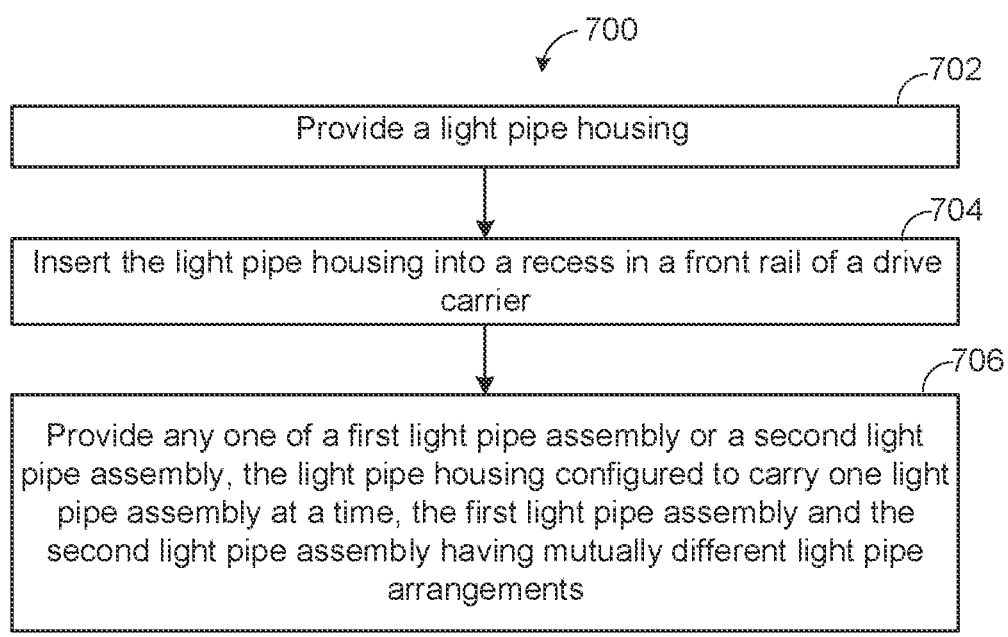
FIG. 7 is a method of installing a light pipe housing in a drive carrier, according to an example implementation of the present subject matter.

FIG. 7 is a method 700 of installing a light pipe housing, such as the light pie housing 100 (FIGS. 1 to 3B) in a drive carrier, such as the drive carrier frame 400 (FIGS. 4 to 5B). The method 700 comprises, at step 702, providing a light pipe housing comprising a base structure. The base structure comprising a front face, a back face opposite to the front face, a first light pipe cavity having a first end on the front face and a second end on the back face, and a second light pipe cavity spaced apart from the first light pipe cavity. The second light pipe cavity has a first end on the front face and a second end on the back face. The base structure further comprises a raised ramp extending between the first light pipe cavity and the second light pipe cavity. The raised ramp has a first edge adjacent to the first light pipe cavity and a second edge adjacent to the second light pipe cavity. The light pipe housing also comprises a top cover having a cut out portion. At step 704, the method 700 comprises inserting the light pipe housing into a recess in a front rail of a drive carrier, such as the drive carrier frame 400. The light pipe housing is inserted in the recess such that the front face of the base structure is exposed at a front of the drive carrier. At step 706, the method 700 comprises providing any one of a first light pipe, such as the light pipe 102 of FIG. 1A or a second light pipe, such as the light pipe 108 of FIG. 1B for the light pipe housing. The light pipe housing is configured to carry one light pipe at a time, where the first light pipe and the second light pipe have mutually different light pipe arrangements.

In some examples, the method 700 may comprise inserting the drive carrier with the drive into a drive bay of an electronic device, such that the location at the front of the drive carrier is exposed at a front of the electronic device. Further, in some examples, during insertion of the light pipe housing into the recess, a ridged extension, such as the ridged extension 420 (FIGS. 4 to 6B), formed on a body of the drive carrier interacts with a slot, such as the slot 138 (FIGS. 1A to 3B and 6A, 6B) running through the front face and the back face of the base structure. Further, during insertion of the light pipe housing into the recess, flanges, such as the flanges 424 and 428 shown in FIGS. 5A and 5B, each formed on an adaptor, such as the adaptors 422 and 426 shown in FIGS. 5A and 5B, interlocks with a respective locking receptable, such as locking receptable 152 shown in FIGS. 1A and 1B, on a sidewall of the base structure of the light pipe housing.

The foregoing description, for purposes of explanation, used specific nomenclature to provide a thorough understanding of the disclosure. However, it will be apparent to one skilled in the art that the specific details are not required in order to practice the systems and methods described herein. The foregoing descriptions of specific examples are presented for purposes of illustration and description. They are not intended to be exhaustive of or to limit this disclosure to the precise forms described. Many modifications and variations are possible in view of the above teachings. The examples are shown and described in order to best explain the principles of this disclosure and practical applications, to thereby enable others skilled in the art to best utilize this disclosure and various examples with various modifications as are suited to the particular use contemplated. It is intended that the scope of this disclosure be defined by the claims and their equivalents below.

We claim:

1. A light pipe housing for a drive carrier, comprising:
   a base structure comprising:
      a front face;
      a back face opposite to the front face;
      a first light pipe cavity having a first end at the front face and a second end at the back face;
      a second light pipe cavity spaced apart from the first light pipe cavity, the second light pipe cavity having a first end at the front face and a second end at the back face; and
      a raised ramp extending between the first light pipe cavity and the second light pipe cavity, the raised ramp having a first edge adjacent to the first light pipe cavity and a second edge adjacent to the second light pipe cavity; and
   a top cover having a cut out portion, wherein the base structure and top cover are in conjunction configured to carry any one of a first light pipe and a second light pipe for the drive carrier, the light pipe housing configured to carry one light pipe at a time, wherein the first light pipe and the second light pipe have mutually different light pipe arrangements.

2. The light pipe housing of claim 1, wherein the cut out portion is positioned above the second edge of the raised ramp, wherein the second edge of the raised ramp is parallel to an edge of the cut out portion when the top cover is engaged with the base structure.

3. The light pipe housing of claim 2, wherein a light receiving end of a light conductor portion of the second light pipe is configured to protrude out of the cut out portion.

4. The light pipe housing of claim 3, wherein at least a portion of the light conductor portion of the second light pipe is configured to be held between the second edge of the raised ramp and an edge of the cut out portion, such that the light receiving end of the light conductor portion of the second light pipe protrudes out of the cut out portion.

5. The light pipe housing of claim 2, wherein a light receiving end of a light conductor portion of the first light pipe is to protrude out of the second end of the first light pipe cavity.

6. The light pipe housing of claim 2, wherein the light receiving end of the light conductor portion, of the second light pipe cavity, protruding out of the cut out portion is positioned above a light receiving end of another light conductor portion, of the second light pipe, protruding out of the second end of the second light pipe cavity.

7. The light pipe housing of claim 1, wherein the base structure comprises a slot running through the front face and the back face of the base structure, wherein the slot is configured to receive a ridged extension formed on a drive carrier.

8. The light pipe housing of claim 1, wherein the base structure further comprises:
- a pair of sidewalls extending between the front face and the back face, wherein each of the pair of sidewalls has a locking clip to interlock in respective grooves in the top cover.

9. The light pipe housing of claim 8, wherein the base structure further comprises:
- a locking receptable formed on each of the pair of sidewalls, wherein the locking receptacle is configured to receive a respective flange formed on an adaptor in a body of a drive carrier.

10. The light pipe housing of claim 1, wherein the light pipe housing has a breadth of about 5.5 millimeters (mm) to 7.5 mm.

11. The drive carrier of claim 1, comprising:
- an EDSFF drive received in the drive carrier; and
- one of the first light pipe or the second light pipe, wherein the one of the first light pipe or the second light pipe is received in the light pipe housing.

12. The light pipe housing of claim 1, wherein the first light pipe is compatible with E3.S EDFF drives.

13. The light pipe housing of claim 1, wherein the second configuration of the light pipe is compatible with E1.S EDSFF drives.

* * * * *